(12) United States Patent
Scheuermann

(10) Patent No.: US 6,469,378 B2
(45) Date of Patent: Oct. 22, 2002

(54) POWER SEMICONDUCTOR MODULE OF HIGH ISOLATION STRENGTH

(75) Inventor: Uwe Scheuermann, Nürnberg (DE)

(73) Assignee: Semikron Elektronik GmbH, Nuremberg (DE)

( * ) Notice: Subject to any disclaimer, the term of this patent is extended or adjusted under 35 U.S.C. 154(b) by 0 days.

(21) Appl. No.: 10/027,802

(22) Filed: Dec. 20, 2001

(65) Prior Publication Data

US 2002/0125563 A1 Sep. 12, 2002

(30) Foreign Application Priority Data

Dec. 20, 2000 (DE) .......................................... 100 63 714
Nov. 27, 2001 (DE) .......................................... 101 58 185

(51) Int. Cl.[7] ............................................. H01L 23/52
(52) U.S. Cl. ...................... 257/691; 287/501; 287/700
(58) Field of Search ................... 257/691, 723, 257/724, 664, 700, 701, 501, 503

(56) References Cited

U.S. PATENT DOCUMENTS

| | | | | |
|---|---|---|---|---|
| 4,617,586 A | * | 10/1986 | Cuvilliers et al. | |
| 5,077,595 A | * | 12/1991 | Fukunaga | |
| 5,291,065 A | * | 3/1994 | Arai et al. | |
| 5,446,318 A | * | 8/1995 | Kioke et al. | |
| 5,466,969 A | * | 11/1995 | Tsunoda | |
| 5,585,672 A | * | 12/1996 | Kioke et al. | |
| 6,201,696 B1 | * | 3/2001 | Shimizu et al. | |
| 6,344,667 B1 | * | 2/2002 | Miyagi | |
| 6,356,173 B1 | * | 3/2002 | Nagata et al. | |

* cited by examiner

Primary Examiner—Sheila V. Clark
(74) Attorney, Agent, or Firm—Darby & Darby

(57) ABSTRACT

A power semiconductor module achieves high isolation strength from a base through selectively positioning a plurality of metal coatings on first and second surfaces and positioning edges of the plurality to beneficially reduce the field strength tangentially to a selected position, especially in a defined critical region directly adjacent a metal coating edge on a first surface opposite the base. This design results in regions which beneficially allow field lines to extend without functional detriment. The beneficial position selection is is achieved by means of an optimization process in which the tangential components of the field strength beside the first or second metallization edge reach identical values.

18 Claims, 5 Drawing Sheets

Prior Art

Prior Art

POWER SEMICONDUCTOR MODULE OF HIGH ISOLATION STRENGTH

BACKGROUND OF THE INVENTION

1. Field of the Invention

The invention relates to a power semiconductor module consisting of a ceramic substrate with metal coating on both sides, with at least one semiconductor component, with connections required for contact, and packaging.

2. Description of the Related Art

In comparison with discrete power switches (such as sliced cells, T0220) power semiconductor modules with or without base plate offer the great advantage of internal isolation from a heat sink. This internal isolation is achieved by using ceramic substrates with metal coatings on both sides, which combine both high isolation strength with great thermal conductivity. This design allows efficient design of power circuits since they provide not only base isolation (isolation from the environment), but also functional isolation (the isolation of various regions of a circuit on which components are mounted).

The definitions of the technical terms used in this related art may be found in Chapter 1 in König, Rao: "*Teilentladungen in Betriebsmitteln der Energietechnik*" [Partial Discharge in Power Technology Facilities], published by VDE Verlag, 1992, ISBN 3-8007-1764-6.

Power semiconductor modules, which are the starting point of this invention, are sufficiently known.

Germain registration DE 196 51 632 discloses a power semiconductor module with ceramic substrate and a base plate. Both EP 0 750 345 and DE 197 00 963 disclose power semiconductor modules with ceramic substrates without base plates. DE 43 10 466 discloses pressure-bonded configurations with ceramic substrates. It is additionally understood from disclosures in U.S. Pat. No. 5,466,969, that additional components, such as sensors and/or drive circuits, may be integrated in a power module.

These developments in prior-art power semiconductors all have in common the use of a ceramic substrate with metal coatings on both sides. This ceramic substrate is produced by a spinel bond between aluminum oxide ($Al_2O_3$) and copper oxide according to a "direct copper bonding" (DCB) process, as described in EP 0 627 760, or according to an active metal brazing (AMB) process.

In addition to copper, it is also conceivable to use aluminum or silver metallization in a similar manner. Methods are also being developed in which an aluminum layer, with aluminum nitrite (AlN) as a ceramic material, is applied to the ceramic material by means of a sintering process. Subsequently, a further metal layer, for example copper, may also be deposited on the aluminum layer.

It is also typical for this type of power semiconductor modules to be filled with a material such as a monomer of silicone rubber that is polymerized after degasification. This silicone rubber ensures isolation.

In all known configurations of these substrates, the surface with the metal coating is smaller than the ceramic surface, which leaves a non-coated surface at the edges of the substrates. Typically this width, and thus the distance from the edge of the metal coating to the edge of the ceramic surface, is the same as the first surface holding the components, which faces away from the heat sink or the base plate and the is same as the second surface which faces the heat sink or the base plate.

Alternatively, the edge of the coating of the second surface is closer to the edge of the ceramic than that of the first surface. This difference is due to the fact that in pressure-bounded power semiconductor modules, for example, where the prime object of the development is a good thermal contact with a heat sink, pressure forces are acting upon the substrate on the peripheral region. Under these circumstances, to prevent the ceramic from breaking, the second coating is applied so that it comes close to the edge of the ceramic. As disclosed in U.S. Pat. No. 5,466,959, additional drive circuits are positionable on the first surface of the substrate. In this case, the metal coating may be left out below the surface used for the drive, to achieve a reduced capacitive coupling.

Generally, requirements for the isolation strength of base isolation are much higher than for the isolation strength of functional isolation. Thus, IEC 1287 requires the following test voltage for base isolation:

$$U_{iso,rms} = \frac{2 \cdot U_m}{\sqrt{2}} + 1000 \text{ V} \tag{I}$$

where $U_m$ represents the maximum constantly recurring voltage in the circuit. Voltage $U_{iso,rme}$ must be applied for one minute during the test of the component (power semiconductor module). The isolation quality of the base isolation depends on how the peripheral region of the ceramic is configured.

In prior art, the peripheral region of the substrate is configured so that the width of the surface between the edge of the metal coating of the first surface and the edge of the ceramic is the same or larger than the width of the surface between the edge of the metal coating of the second surfaces and the edge of the ceramic.

As disclosed in U.S. Pat. No. 5,466,969, the peripheral region of the power component of the circuit arrangement has this type of configuration. Unfortunately, this configuration has disadvantages for the isolation quality of the substrate's base isolation.

In this type of device, the metal coatings of the two ceramic surfaces act as a plate condensator with the ceramic as a dielectric between the plates. Typically, the metal coating lies on a base plate or a heat sink and thus at a defined reference potential.

The different parts of the metal coating of the first surface may have different potentials. In related art, the metal coatings for optional drive circuits or sensors, etc. often have ground potential. When the power semiconductor module on a normally metallic heat sink is arranged at reference potential that does not necessarily correspond to the ground potential, the result is a very inhomogeneous field path for the electric field in the outer region of the plate condensator.

A high density of equipolar lines represents a high field strength. The isolation quality of the base isolation of the non-coated peripheral region of the ceramic or the region between a metal coating of the first surface which lies between a high potential and another potential, is determined by the field strength directly on the surface, tangentially to the first surface. This field strength is represented by the tangential distance of the equipotential lines.

The highest density of equipotential lines on the ceramic surface, and thus the most critical region for the isolation strength of the base isolation, is on the first surface of the ceramic immediately following the surface of the metal coating with the high potential.

The configuration of the peripheral region of a substrate has a decisive effect on the isolation and partial-discharge strength of power semiconductor modules. This effect is less significant in the case of thinner ceramic layers. With a ceramic thickness of 0.38 mm, (which is customary today), this effect becomes dominant above 5000 V.

With the integration of the above mentioned additional functions into the power semiconductor module, the isolation of these components, which are directly on the substrate, becomes another important characteristic of reliability.

Since, for example, the sensor signals are being evaluated directly by the drive circuits, an electrical separation between the power circuit and the sensor must be ensured for proper operation. This electrical separation is achieved by means of an arrangement of two metal coatings isolated from each other. Within the power circuit, only a functional isolation must be ensured for metal coatings thus isolated from each other. On the other hand, a base isolation must be established for the additional integrated functions (such as sensors).

In general, the requirements for base isolation are higher, depending on the particular application. For example, in the series-connection of power semiconductor modules, the reference potential of an individual power semiconductor module dos not have to be identical to the ground potential. However, since for technical reasons, usually all sensors of a series circuit of power semiconductor modules are at identical potentials, the potential difference between the power circuit of a power semiconductor module and the sensor can be higher than within the power circuit itself.

For that reason, two partial tests are conducted to check the isolation strength of a power module with sensor elements or other additional integrated functions. In the first partial test, the sensor is placed at a common high potential with the function circuit, and the base isolation is tested in an ambient environment, whereby the same requirements apply to the sensor and the associated regions of the metal coating that apply to the regions of the functional circuit.

In the second partial test, the sensor is held at ambient potential, and only the regions of the functional circuit are placed at high potential. A potential gradient occurs between the metal coating belonging to the functional circuit and that belonging to the sensor, and this requires appropriate measures to ensure basis isolation. Both partial tests together ensure that the sensor can be operated at any potential between the ambient potential and the maximum admissible isolation voltage of the power module.

The difficulties resulting from these requirements are also discussed in EP 1 111 970, and a method of improving the isolation strength is suggested, but without using the geometrical optimization presented in the present invention.

OBJECTS AND SUMMARY OF THE INVENTION

It is an object of the present invention to provide a power semiconductor module of high isolation strength which overcomes the drawbacks of the related art.

It is another object of the present invention is to increase the isolation strength of the base isolation of power semiconductor modules, whereby these modules maybe additionally provided with metal coatings (at ground potential or at another potential) for sensors and/or drive circuits of the substrate, and to improve the partial discharge characteristics.

It is another object of the present invention to provide a design which equalizes a tangental component of field lines or equipotential lines between a first edge on a first surface of a substrate with a second edge on a second surfaced of the substrate.

The present invention relates to a power semiconductor module with high isolation strength that achieves high isolation strength from a base through selectively positioning a plurality of metal coatings on first and second surfaces and positioning edges of the plurality to beneficially reduce the field strength tangentially to a selected position, especially in a defined critical region directly adjacent a metal coating edge on the first surface. This results in providing regions which beneficially allow field lines to extend without functional detriment. The beneficial selection is is achieved by means of an optimization process in which the tangential components of the field strength beside the first or second metallization edge reach identical values.

According to an embodiment of the present invention, there is provided a power semiconductor module, including connective elements enabling effective operation and at least one semiconductor component, the power semiconductor module comprising: at least one substrate, the substrate having at least a first surface opposite a second surface, a substrate edge on the substrate joining the first and the second surface, at least a first metal coating on a first surface of the substrate, at least a second metal coating on a second surface of the substrate, the second metal coating between the second surface and a facing surface, the first metal coating having a first metal coating edge, the first metal coating edge a distance a from the substrate edge, the second metal coating having a second metal coating edge, at least the first metal coating edge at a high potential to the substrate edge during an operation of the power semiconductor module, the second metal coating edge a distance b from the substrate edge, and the distance a being less than the distance b, whereby field lines existing between the first metal coating and the second metal coating, and through the substrate, during the operation, beneficially extend away from the second surface opposite the first metal coating edge, thereby beneficially reducing a tangential component of a field strength proximate the first metal coating edge, reducing the field strength and field density on the first surface, and increasing an isolation strength of a base isolation of the substrate.

According to another embodiment of the present invention there is provided a power semiconductor module, wherein: the distance a and the distance b are selected to equalize the tangential component of the field strength proximate the first metal coating edge with another tangential component of the field strength proximate the second metal coating edge.

According to another embodiment of the present invention there is provided a power semiconductor module, further comprising: a difference x defined between the distance a and the distance, b, and the difference x being an absolute value between 0.75 mm and 1.25 mm.

According to another embodiment of the present invention there is provided a power semiconductor module, the substrate is a ceramic selected from the group consisting of aluminum oxide, aluminum nitrite, beryllium oxide and silicone nitrite.

According to another embodiment of the present invention there is provided a power semiconductor module, wherein: the first metal coating includes a metal selected from the group consisting of copper, aluminum, and silver, and the second metal coating includes a metal selected from the group consisting of copper, aluminum, and silver.

According to another embodiment of the present invention there is provided a power semiconductor module, wherein: the first metal coating and the second metal coating are metal alloys.

According to another embodiment of the present invention there is provided a power semiconductor module, wherein: the first metal coating and the second metal coating are a plurality of layers, and the first metal coating and the second metal coating are a plurality of metals in a mixed form.

According to another embodiment of the present invention there is provided a power semiconductor module, wherein: the first metal coating and the second metal coating are applied on respective first and second surfaces of the substrate by at least one of a Direct Copper Bonding (DCB) process and an Active Metal Brazing (AMB) process.

According to another embodiment of the present invention there is provided, a power semiconductor module, including connective elements enabling effective operation and at least one semiconductor component, the power semiconductor module comprising: at least one substrate, the substrate having at least a first surface opposite a second surface, a substrate edge on the substrate joining the first and the second surface, at least a first metal coating on a first surface of the substrate, at least a second metal coating on a second surface of the substrate, the second metal coating between the second surface and a facing surface, the first metal coating having a first metal coating edge, the first metal coating edge a distance f from the substrate edge, the second metal coating having a second metal coating edge, at least the first metal coating edge at a higher potential to the substrate edge during an operation of the power semiconductor module than at least a third metal coating on the first surface between the first metal edge and the substrate edge, the third metal coating having a third metal coating edge opposite the first metal coating edge and a fourth metal coating edge, the second metal coating edge a distance g from the substrate edge, and the distance f being less than the distance g, whereby field lines existing between the first, the second, and the at least third metal coating, and through the substrate, during the operation, beneficially extend away from the second surface opposite the first metal coating edge, thereby beneficially reducing a tangential component of a field strength proximate the first metal coating edge, reducing the field strength and field density on the first surface, and increasing an isolation strength of a base isolation of the substrate.

According to another embodiment of the present invention there is provided a power semiconductor module, wherein: the distance f and the distance g are selected to equalize the tangential component of the field strength proximate the first metal coating edge with a tangential component of the field strength proximate the second metal coating edge.

According to another embodiment of the present invention there is provided a power semiconductor module, further comprising: at least fourth metal coating on the second surface of the substrate between the second metal coating and the substrate edge, the at least fourth metal coating having a fifth metal coating edge opposite the second metal coating edge and a sixth metal coating edge, the third metal coating edge and the fifth metal coating edge at similar distances from the substrate edge, a distance c between the first metal coating edge and the third metal coating edge, a distance e between the second metal coating edge and the fifth metal coating edge, and the distance c being less than the distance e, whereby a density of field lines adjacent the first metal coating edge are widened and the field strength on the first surface of the substrate is beneficially reduced.

According to another embodiment of the present invention there is provided a power semiconductor module, wherein: the distance e is 2.0 mm±0.25 mm and the distance c is 1.0 mm±0.25 mm.

According to another embodiment of the present invention there is provided a power semiconductor module, wherein: the substrate is a ceramic selected from the group consisting of aluminum oxide, aluminum nitrite, beryllium oxide and silicone nitrite.

According to another embodiment of the present invention there is provided a power semiconductor module, wherein: the first, the second, the third, and the fourth metal coatings include a metal selected from the group consisting of copper, aluminum, and silver.

According to another embodiment of the present invention there is provided a power semiconductor module, wherein: the first, the second, the third, and the fourth metal coatings are metal alloys.

According to another embodiment of the present invention there is provided a power semiconductor module, wherein: the first, the second, the third, and the fourth metal coatings are each a plurality of layers, and the first, the second, the third, and the fourth metal coatings are each a plurality of metals in a mixed form.

According to another embodiment of the present invention there is provided a power semiconductor module, wherein: the first, the second, the third, and the fourth metal coatings are applied on respective first and second surfaces of the substrate by at least one of a Direct Copper Bonding (DCB) process and an Active Metal Brazing (AMB) process.

According to another embodiment of the present invention there is provided a power semiconductor module, further comprising: at least a fifth metal coating on the first surface between the third metal coating and the substrate edge, at least a sixth metal coating on the second surface between the fourth metal coating and the substrate edge, the fifth metal coating having a seventh metal coating edge adjacent the fourth metal coating edge and an eight metal coating edge, the sixth metal coating having a ninth metal coating edge adjacent the sixth metal coating edge and a tenth metal coating edge, a distance h defined between the fourth metal coating edge and the seventh metal coating edge and equivalent to the distance c, a distance I defined between the sixth metal coating edge and the ninth metal coating edge and equivalent to the distance e, and the eighth metal coating edge being nearer to the substrate edge than the seventh metal coating edge, whereby the distances e, I, f, g, and c are selected to equalize tangential components of the field strength proximate the first and the seventh metal coating edge with tangental components of the field strength proximate the second and the ninth metal coating edge, thereby, reducing the field strength and field density on a non-coated region of the first surface, and increasing an isolation strength of a base isolation of the substrate.

The above, and other objects, features and advantages of the present invention will become apparent from the following description read in conjunction with the accompanying drawings, in which like reference numerals designate the same elements.

BRIEF DESCRIPTION OF THE PREFERRED EMBODIMENTS

Figure 1:
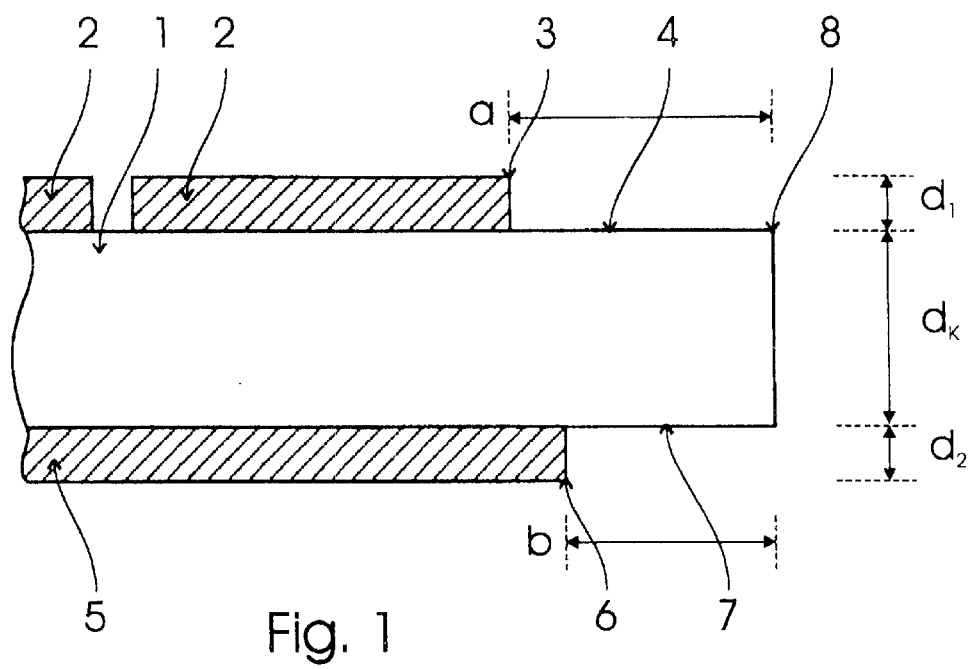
FIG. 1 is a cross-sectional view of the important inventive geometry of the peripheral region of a substrate for power semiconductor modules.

Referring now to FIG. 1, the important reference geometry in the peripheral region of a substrate for a power semiconductor module, includes a ceramic layer 1. Ceramic layer 1 has a thickness $d_K$, which is in-part coated on a first surface 4 with a first metal coating 2 having a thickness $d_1$ and on a second surface 7 with a second metal coating 5, having a thickness $d_2$.

Metal coating 2 serves as the carrier of the power circuit (not shown) and is therefore usually internally structured. Metal coating 5 is either connected with a base plate (not shown) or is directly in contact with a heat sink (not shown), and is usually not internally structured.

Typically, the peripheral region of ceramic 1 has no metal coating, as shown, and as will be described. On first surface 4, this non-coated region has a width a, which is the distance between an edge 3 of metal coating 2 and an edge 8 of ceramic layer 1 (the edge of the substrate). On second surface 7, the non-coated region has a width b which is the distance between an edge 6 of metal coating 5 and edge 8 of ceramic layer 1. In the present invention, width a≠width b, and a<b is beneficial. It should be noted that in the related art this relationship did not exist, and either a=b or a>b.

Figure 2:
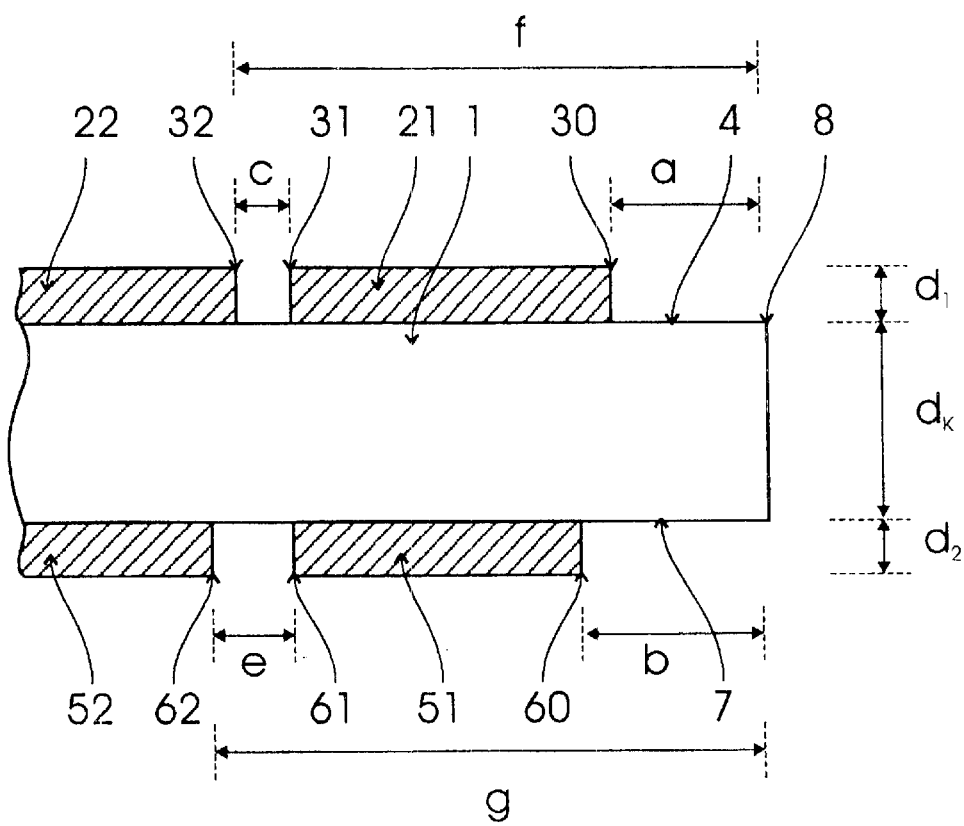
FIG. 2 is a cross-sectional view of the important inventive geometry of a substrate for power semiconductor modules with additional integrated functions.

Referring now to FIG. 2, the inventively important geometry of a substrate for power semiconductor components is shown enabling additional integrated functions. In the present embodiment, the substrate includes ceramic layer 1 having thickness $d_K$. A first and a second metal coating 22, 21 are respectively on first surface 4, as shown. Metal coatings 21,22 each have a thickness $d_1$.

In the present embodiment, at least one metal coating 52 is arrayed on second surface 7 of ceramic layer 1. As shown, another metal coating 51 is additionally arrayed on second surface 7 of ceramic layer 1. The at least one metal coating 52 and metal coating 51 each have a thickness of $d_2$.

First metal coating 22 serves as carrier for the power circuit and is therefore usually internally structured.

Second metal coating 21 serves to accommodate additional functional units such as sensors and/or a drive circuit (all not shown). As a rule, second metal coating 21 lies at the potential of a base plate or a heat sink or at any other potential, as is customary for example with series-connected power semiconductor modules (not shown). Metal coatings 51, 52 are either connected with the base plate or are in direct contact with the heat sink (again, each not shown).

In the present embodiment, the peripheral region of ceramic layer 1 has no metal coating, as shown. This non-coated region has width a on first surface 4, which is the distance between an edge 30 of the further metal coating 21 and edge 8 of ceramic layer 1. First metal coating 22 is at high potential, and includes an edge 32 at a distance c from an edge 31 of second metal coating 21. A width f is the total distance from first metal coating 22, at its edge 32, and the edge (8) of ceramic layer 1.

Second surface 7 of ceramic layer 1 has at the least one metal coating 52 whose edge 62 is at a distance g from edge 8 of ceramic layer 1. Where second surface 7 of ceramic layer 1 has another metal coating 51 arranged between metal coating 52 and edge 8 of ceramic layer 1, it's edge 60 is at a distance b from edge 8. An edge 61 of metal coating 51 is a distance e from edge 62 from metal coating 52. Typically, there is an identical distance from edge 61 of metal coating 51 on second surface 7 to edge 8 as there is between edge 31 of metal coating 21 on first surface 4 and edge 8. In the instant disclosure it is noted that f<g, in contrast to the related art where either f=g or f>g.

It is noted that in FIGS. 3 to 6, the calculation of the equipotential lines or the tangential field strength is based on the following assumptions in Table 1:

TABLE 1

| Coating | Material | Thickness | Relative dielectric constant $\epsilon/\epsilon_v$ |
| --- | --- | --- | --- |
| Metal coating (2, 21, 22) of the first surface (4) | Copper | 0.3 mm | — |
| Ceramic Layer (1) | Aluminum nitrite | 1.0 mm | 9.0 |
| Metal coating (5, 51, 52) of the first surface (4) | Copper | 0.3 mm | — |
| Ambient medium (9) | Silicone rubber | — | 2.9 |

Note:
The potential of metal coatings 2, 22 corresponds to 9000 V; the potential of the other metal coatings 21, 5, 51, and 52 corresponds to the ground potential; and the distance between all equipotential lines corresponds to 530 V.

Figure 3:
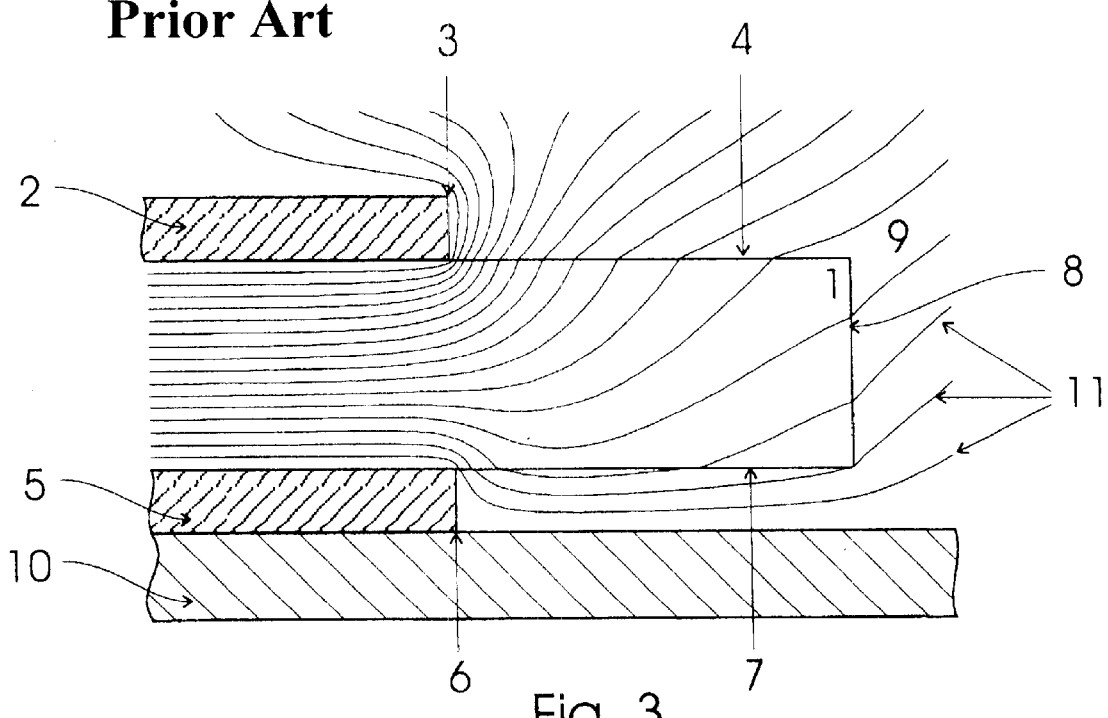
FIG. 3 is a cross-sectional view of a peripheral region of a conventional substrate for power semiconductor modules.

Referring now to FIG. 3, a plurality of calculated equipotential lines 11 are displayed in the peripheral region about ceramic layer 1 on a field plate 10 in a conventional substrate for power semiconductor modules. Here, a distance (distance a) between edge 3 of metal coating 2 on first surface 4, and edge 8 of ceramic substrate 1 is the same as a distance (distance b) between an edge 6 of metal coating 5 on second surface 7 and edge 8. The distance between the edge of both metal coatings 2, 5 and edge 8 of ceramic layer 1 equals 2 mm and a=b.

It is conventionally understood that the closer together equipotential lines 11 follow along a certain vector, the greater the field strength along that certain vector. As shown, the greatest equipotential-line density directly on the surface and running tangentially to same is found immediately before metallization edge 3. This occurrence is referred to as a "field peak", and unfortunately leads to a very inhomogeneous field strength path on the entire non-coated surface of ceramic layer 1. Using the assumptions of the above table, a maximum tangential field strength component of unfortunately more than 25 kV/mm results at a distance of 20 mm beside metallization edge 3.

The field path shown also demonstrates that a simultaneous widening of the edge on the first and second surfaces (i.e. simultaneously increasing distances a, b) has no effect on the isolation strength, since the field peak, i.e. the field path immediately adjacent to edge 3 of metal coating 2 is not affected by this adaptation.

Figure 4:
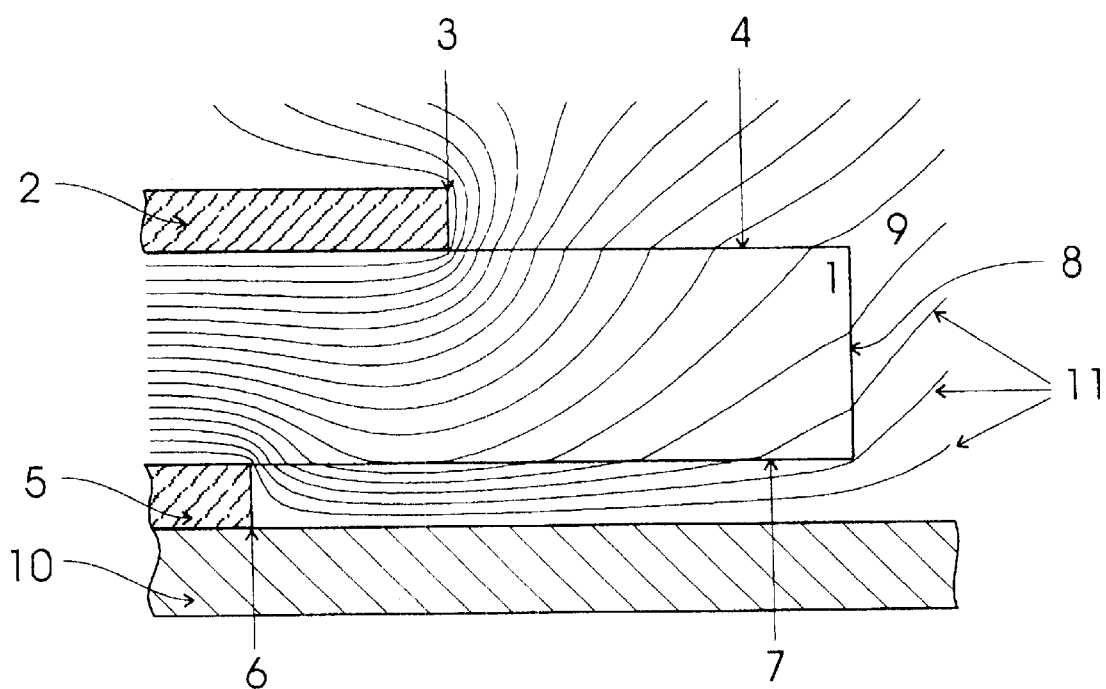
FIG. 4 is a cross-sectional view of the present invention showing inventive development of the peripheral region of a substrate for power semiconductor modules.

Referring now to FIG. 4, according to the present invention equipotential lines 11 are calculated according to the assumptions in Table 1. In this embodiment, distance a from edge 3 of metal coating 2 to edge 8 of ceramic layer 1 is shorter than distance b from edge 6 of metal coating 5 to edge 8. As shown, distance a is<distance b. In the present embodiment distance a=about 2 mm and distance b=about 3 mm.

It can be clearly recognized that due to the present embodiment of the invention there is a reduction of the tangential component of the field strength directly beside metallization edge 3 on first surface 4. The effect of field plate 10 can be clearly recognized here, since equipotenitial lines 11 already widen within ceramic layer 1, within the region under of metal coating 2. Consequently, the density of equipotential lines 11 on first surface 4 of ceramic layer 1 adjacent metallization edge 3 is significantly reduced.

Figure 5:
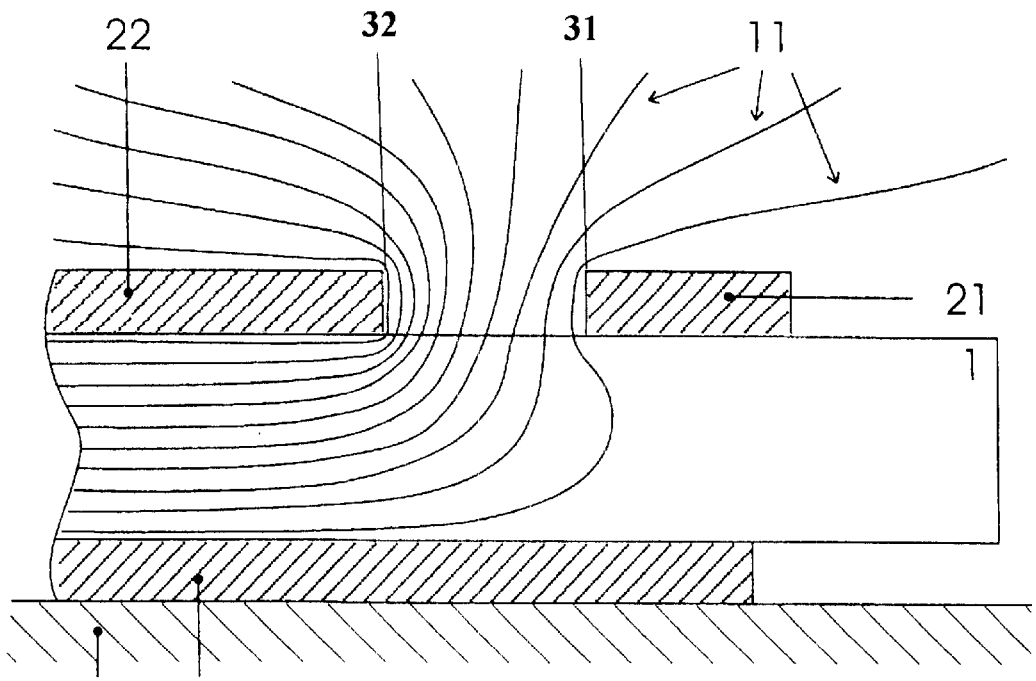
FIG. 5 is a cross-sectional view of a peripheral region of a conventional substrate for power semiconductor modules with additional integrated functions.

Referring now to FIG. 5, a peripheral region is shown with calculated equipotential lines 11 in a conventional substrate for power semiconductor modules provided with additional integrated functions in the peripheral region.

As can be clearly shown, distance c, between edge 31 of metal coating 21 at ground potential, and edge 32 of metal coating 22 is 1 mm and is at a potential of 9000 V.

As noted above, the closer equipotential lines 11 follow along a certain vector, the greater is the field strength along that vector. The greatest equipotential-line density directly on the surface, and running tangentially to same, is found immediately before edge 32 of metal coating 22. As also noted above, this so-called field peak leads to a very inhomogeneous field strength path on the entire non-coated surface of width c ©=1 mm) on the upper surface 4 of ceramic layer 1. Using the assumptions of the above Table 1, a tangential field strength component of unfortunately more than 29 kV/mm results at a distance of 20 mm beside metallization edge 32.

The field path shown above also demonstrates that edge widths a, b have no effect on the isolation strength. It is noted that widths a, b (as shown in FIG. 5) are merely presented for easy illustrative and not limitation purposes related to the instant figure. Readers are directed to the discussion of FIG. 1 where it was noted that conventionally a=b or b<a.

Figure 6:
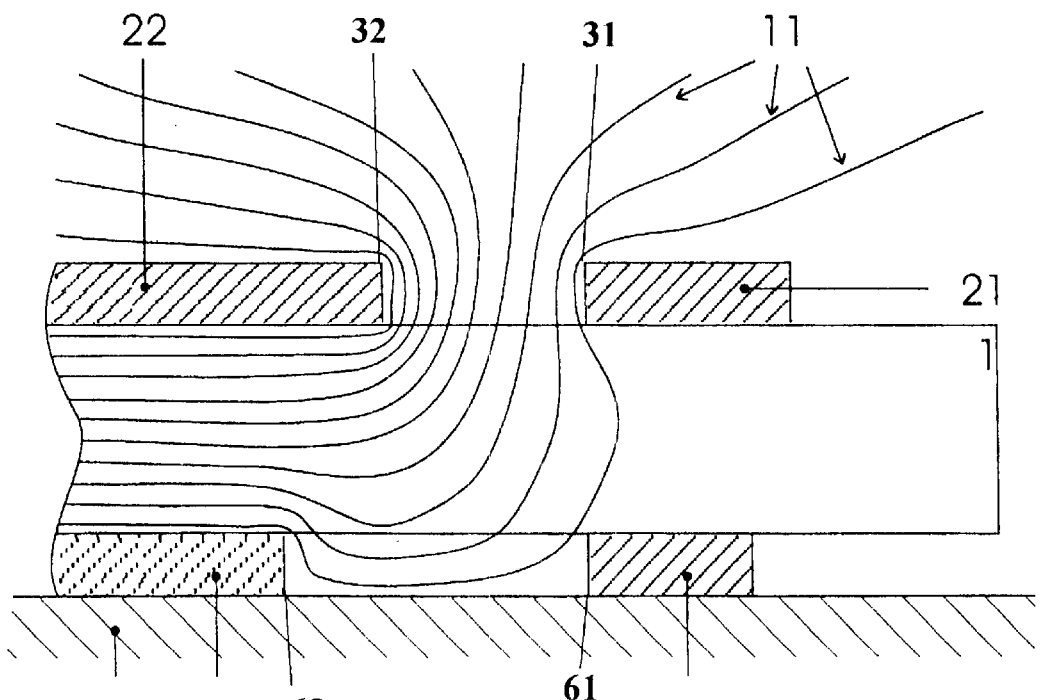
FIG. 6 is a cross-sectional view of the present invention showing an inventive embodiment of the peripheral region of a substrate for power semiconductor modules with additional integrated functions.

Referring now to FIG. 6, according to the present invention a substrate for power semiconductor modules with additional integrated functions is shown in a peripheral region. Here, equipotential lines 11 are calculated according to the above assumptions in Table 1. Further, one-piece metal coating 5 (shown in FIG. 5) was interrupted and replaced by two metal coatings 51, 52 defining a notch having a width e=2 mm., at the same potential as above. It should be noted that by providing this notch, the condition that g>f is met. This condition provides that edge 32 of metal coating 22 is therefore at shorter distance f from edge 8 of ceramic layer 1, than distance g from edge 62 of metal coating 52.

Here again, the reduction of the tangential component of the field strength directly adjacent edge 32 and the effect of field plate 10 can be clearly recognized since equipotential lines 11 now expand in the region between metal coatings 51, 52 and thus, a widening of equipotential lines 11 occurs in the region of edge 32. Consequently, the density of equipotential lines 11 and thus the field strength on first surface 4 of ceramic layer 1 on metal coating 22 is reduced to a value of beneficial value of approximately 25.3 kV/mm.

For purposes of the present invention, additional embodiments where metal coating 51 is completely left out may exist, as long as the condition that g>f is still met. However, metal coating 51 is otherwise helpful in ensuring the mechanical stability of the power semiconductor module. Metal coating 51 may additionally be necessary for the thermal coupling to the heat sink if a thermal sensor is used. Such requirements are based on consumer demand.

As noted above in the discussion of FIG. 5, widths a, b (as shown in FIG. 6) do not represent the conventional art, but are merely presented for easy illustrative and not limitation purposes. Readers are directed to the discussion of FIG. 1 where it was noted that conventionally a=b or b<a.

Figure 7:
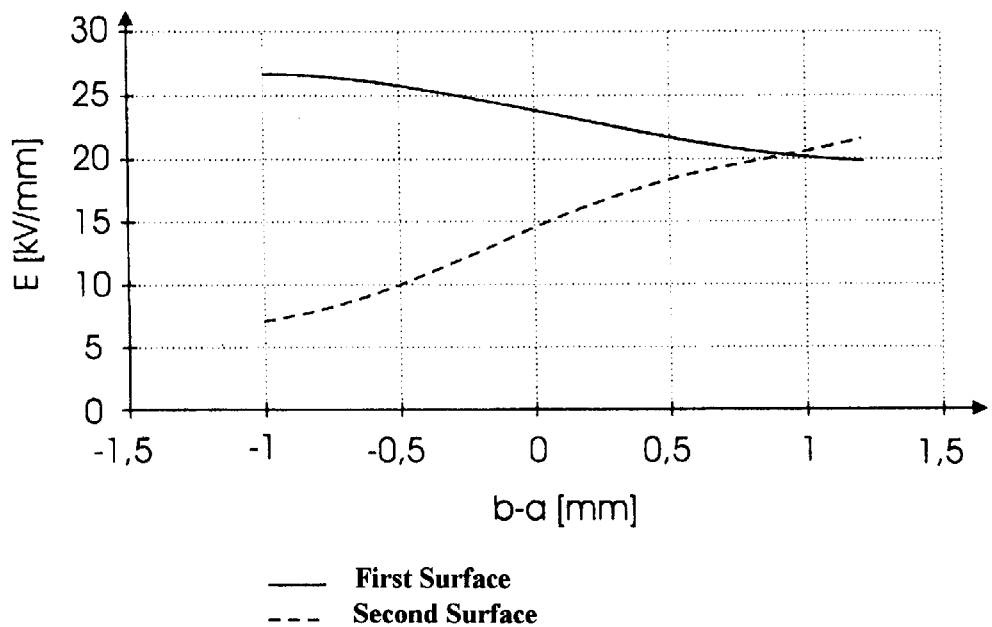
FIG. 7 is a graph of the results of the present invention as demonstrated in the optimized example of the peripheral region of a power semiconductor module.

Referring now to FIG. 7, where the results of the inventive optimization method using the practical example of a substrate for power semiconductor modules according to FIG. 4. The optimization method for finding distance b from edge 6 of metal coating 5 at a given distance from edge 3 of metal coating 2 to edge 8 of ceramic layer 1, is based on the following assumptions:

The tangential component of the electric field strength at the boundary between ceramic layer 1 and the ambient medium can accelerate movable electrical charges. If the energy absorbed during the mean free path length is enough to produce further ions on impact, an avalanche breakdown occurs which leads to actual breakdown of the isolation in the form of a flashover. It is therefore necessary to minimize energy W on a mean free path length $l_{fr}$ which is transferred by the tangential component of electric field strength $E_t$ along the surface of ceramic layer 1 to a free charge q:

$$W = q \int_0^{l_{fr}} E_t \cdot ds \qquad (II)$$

It should be understood, however, that since in practical applications the edges of the plurality of metal coatings are not clearly defined boundaries, only an estimate is used here by determining the maximum of the tangential component and the local value of the tangential component at a distance of 20 $\mu$m from the metallization edge.

By widening distance b from edge 6 of metal coating 5 to edge 8, the field strength at metallization edge 3 at first surface 4 is beneficially reduced. If the above assumptions are applied, the optimization method at a distance of a=2 mm from edge 3 to edge 8, would provide a distance of b=3 mm for the distance from edge 6 to edge 8.

With these values, the tangential component of the electric field strength reaches the same value when metal coatings (3 or 6) are at a distance of 20 $\mu$m. By this understanding, it is possible to reduce the tangential component of the electric field strength in the immediate vicinity of edge 3 by approximately 20% in comparison with the conventional electric field (shown in FIG. 3). Consequently, the isolation strength of the base isolation of the entire substrate can be beneficially increased accordingly.

Figure 8:
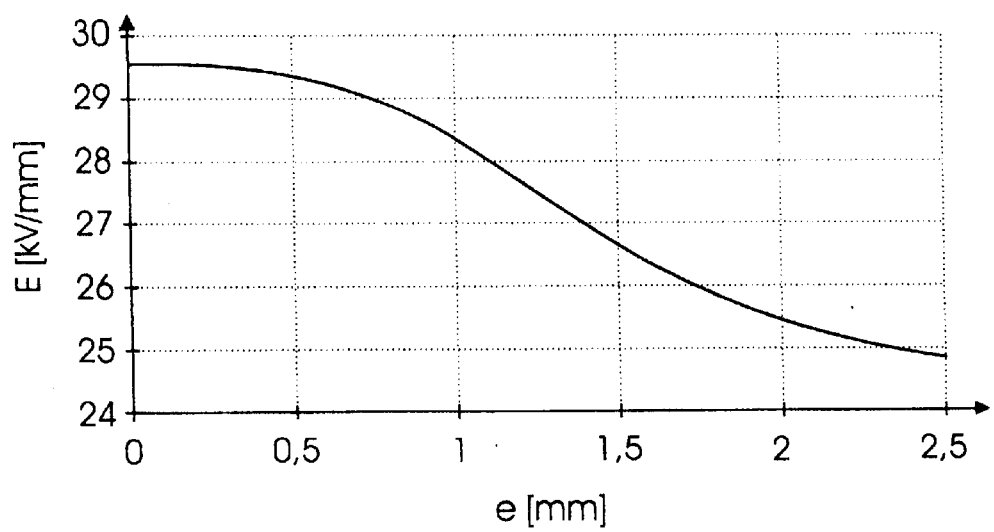
FIG. 8 is a graph of the results of the present invention idea as demonstrated in the optimized example of the peripheral region of a power semiconductor module with additional integrated functions.

Referring now to FIG. 8, where the results of the inventive optimization method using the practical example according to FIG. 6 are displayed. Here, the optimization method results are shown for finding distance e from edge 62 of metal coating 52 to edge 61 of metal coating 51, at a given distance of c=1 mm between edge 32 of metal coating 22 and edge 31 of metal coating 21, and setting edge 31 and edge 61 at the same distance from edge 8. This method is based on the same assumptions as those described under FIG. 7.

As can be seen, by widening distance e from edge 62 to edge 61, the field strength at edge 32 is beneficially reduced. For the assumptions on which the method is based, the calculation method for distance e=2 mm, from edge 62 to edge 61, results in a beneficial reduction of the tangential field strength by about 15% in comparison with the detrimental related art. Consequently, the isolation strength of the base isolation of the entire substrate is also beneficially increased accordingly.

Figure 9:
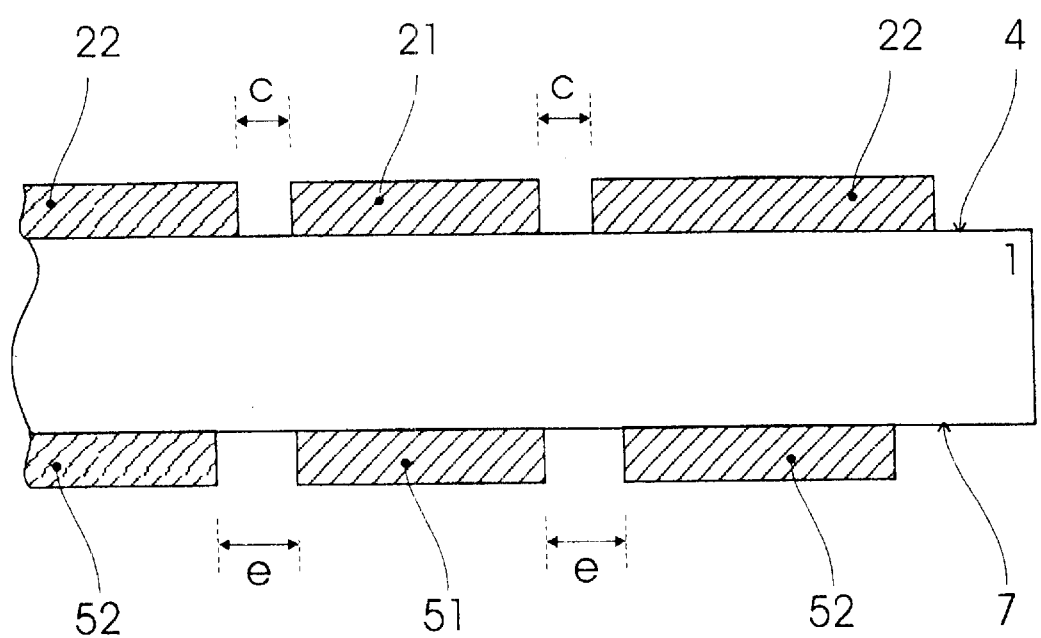
FIG. 9 is a cross-sectional view of a further embodiment of an inventive substrate for power semiconductor modules.

Referring now to FIG. 9, a further embodiment of an inventive substrate for power semiconductor modules is shown. As shown, metal coating 21 for a sensor (not shown) is surrounded by second metal coatings 22 on each side. The corresponding metal coatings 52, on second surface 7 are moved away from metal coating 51 by a distance of e-c in comparison with the edge of coatings 22 on first surface 4. It should therefore be readily recognizable that the present invention is easily adapted and applied to additional an alternative embodiments within the field beyond those presented for simple discussion here.

It should be understood by those skilled in the art that the instant inventive embodiments discussed may be readily adapted to power semiconductor modules with or without base plates.

It should be additionally understood that in the peripheral region of power semiconductor modules, the base plate, or in the case of modules without base plates, the heat sink acts as a field plate and leads to the reduction in the field strength in the non-coated region of the first surface. Consequently, for purposes of understanding the conceptual invention, where described the base plate or field plate may be alternatively referred to without misunderstanding as providing a facing surface opposite the ceramic layer.

Although only a single or few exemplary embodiments of this invention have been described in detail above, those skilled in the art will readily appreciate that many modifications are possible in the exemplary embodiment(s) without materially departing from the novel teachings and advantages of this invention. Accordingly, all such modifications are intended to be included within the spirit and scope of this invention as defined in the following claims.

Where present in the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies entirely on friction between a wooden part and a cylindrical surface, a screw's helical surface positively engages the wooden part, and a bolt's head and nut compress opposite sides of at least one wooden part, in the environment of fastening wooden parts, a nail, a screw, and a bolt may be readily understood by those skilled in the art as equivalent structures.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A power semiconductor module, including connective elements enabling effective operation and at least one semiconductor component, said power semiconductor module comprising:

at least one substrate;
   said substrate having at least a first surface opposite a second surface;
   a substrate edge on said substrate joining said first and said second surface;
   at least a first metal coating on a first surface of said substrate;
   at least a second metal coating on a second surface of said substrate;
   said second metal coating between said second surface and a facing surface;
   said first metal coating having a first metal coating edge;
   said first metal coating edge a distance a from said substrate edge;
   said second metal coating having a second metal coating edge;
   at least said first metal coating edge at a high potential to said substrate edge during an operation of said power semiconductor module;
   said second metal coating edge a distance b from said substrate edge; and
   said distance a being less than said distance b, whereby field lines existing between said first metal coating and said second metal coating, and through said substrate, during said operation, beneficially extend away from said second surface opposite said first metal coating edge, thereby beneficially reducing a tangential component of a field strength proximate said first metal coating edge, reducing said field strength and field density on a non-coated region of said first surface, and increasing an isolation strength of a base isolation of said substrate.

2. A power semiconductor module, according to claim 1, wherein: said distance a and said distance b are selected to equalize said tangential component of said field strength proximate said first metal coating edge with another tangential component of said field strength proximate said second metal coating edge.

3. A power semiconductor module, according to claim 1, further comprising:

a difference x defined between said distance a and said distance b; and
   said difference x being an absolute value between 0.75 mm and 1.25 mm.

4. A power semiconductor module, according to claim 1, wherein: said substrate is a ceramic selected from the group consisting of aluminum oxide, aluminum nitrite, beryllium oxide and silicone nitrite.

5. A power semiconductor module, according to claim 1, wherein:

said first metal coating includes a metal selected from the group consisting of copper, aluminum, and silver; and
   said second metal coating includes a metal selected from the group consisting of copper, aluminum, and silver.

6. A power semiconductor module, according to claim 1, wherein: said first metal coating and said second metal coating are metal alloys.

7. A power semiconductor module, according to claim 1, wherein:

said first metal coating and said second metal coating are a plurality of layers; and
   said first metal coating and said second metal coating are a plurality of metals in a mixed form.

8. A power semiconductor module, according to claim 1, wherein: said first metal coating and said second metal coating are applied on respective first and second surfaces of said substrate by at least one of a Direct Copper Bonding (DCB) process and an Active Metal Brazing (AMB) process.

9. A power semiconductor module, including connective elements enabling effective operation and at least one semiconductor component, said power semiconductor module comprising:

at least one substrate;

said substrate having at least a first surface opposite a second surface;

a substrate edge on said substrate joining said first and said second surface;

at least a first metal coating on a first surface of said substrate;

at least a second metal coating on a second surface of said substrate;

said second metal coating between said second surface and a facing surface;

said first metal coating having a first metal coating edge;

said first metal coating edge a distance f from said substrate edge;

said second metal coating having a second metal coating edge;

at least said first metal coating edge at a higher potential to said substrate edge during an operation of said power semiconductor module than at least a third metal coating on said first surface between said first metal edge and said substrate edge;

said third metal coating having a third metal coating edge opposite said first metal coating edge and a fourth metal coating edge;

said second metal coating edge a distance g from said substrate edge; and said distance f being less than said distance g, whereby field lines existing between said first, said second, and said at least third metal coating, and through said substrate, during said operation, beneficially extend away from said second surface opposite said first metal coating edge, thereby beneficially reducing a tangential component of a field strength proximate said first metal coating edge, reducing said field strength and field density on a non-coated region of said first surface, and increasing an isolation strength of a base isolation of said substrate.

10. A power semiconductor module, according to claim 9, wherein: said distance f and said distance g are selected to equalize said tangential component of said field strength proximate said first metal coating edge with a tangential component of said field strength proximate said second metal coating edge.

11. A power semiconductor module, according to claim 9, further comprising:

at least a fourth metal coating on said second surface of said substrate between said second metal coating and said substrate edge;

said at least fourth metal coating having a fifth metal coating edge opposite said second metal coating edge and a sixth metal coating edge;

said third metal coating edge and said fifth metal coating edge at similar distances from said substrate edge;

a distance c between said first metal coating edge and said third metal coating edge;

a distance e between said second metal coating edge and said fifth metal coating edge; and said distance c being less than said distance e, whereby a density of field lines adjacent said first metal coating edge are widened and the field strength on said first surface of said substrate is beneficially reduced.

12. A power semiconductor module, according to claim 1, wherein: said distance e is 2.0 mm±0.25 mm and said distance c is 1.0 mm±0.25 mm.

13. A power semiconductor module, according to claim 9, wherein: said substrate is a ceramic selected from the group consisting of aluminum oxide, aluminum nitrite, beryllium oxide and silicone nitrite.

14. A power semiconductor module, according to claim 9, wherein: said first, said second, said third, and said fourth metal coatings include a metal selected from the group consisting of copper, aluminum, and silver.

15. A power semiconductor module, according to claim 9, wherein: said first, said second, said third, and said fourth metal coatings are metal alloys.

16. A power semiconductor module, according to claim 9, wherein:

said first, said second, said third, and said fourth metal coatings are each a plurality of layers; and said first, said second, said third, and said fourth metal coatings are each a plurality of metals in a mixed form.

17. A power semiconductor module, according to claim 9, wherein: said first, said second, said third, and said fourth metal coatings are applied on respective first and second surfaces of said substrate by at least one of a Direct Copper Bonding (DCB) process and an Active Metal Brazing (AMB) process.

18. A power semiconductor module, according to claim 11, further comprising:

at least a fifth metal coating on said first surface between said third metal coating and said substrate edge;

at least a sixth metal coating on said second surface between said fourth metal coating and said substrate edge;

said fifth metal coating having a seventh metal coating edge adjacent said fourth metal coating edge and an eight metal coating edge;

said sixth metal coating having a ninth metal coating edge adjacent said sixth metal coating edge and a tenth metal coating edge;

a distance h defined between said fourth metal coating edge and said seventh metal coating edge and equivalent to said distance c;

a distance I defined between said sixth metal coating edge and said ninth metal coating edge and equivalent to said distance e; and said eighth metal coating edge being nearer to said substrate edge than said seventh metal coating edge, whereby said distances e, I, f, g, and c are selected to equalize tangential components of said field strength proximate said first and said seventh metal coating edge with tangental components of said field strength proximate said second and said ninth metal coating edge, thereby, reducing said field strength and field density on a non-coated region of said first surface, and increasing an isolation strength of a base isolation of said substrate.

* * * * *